United States Patent [19]

Liaw et al.

[11] Patent Number: 5,593,922
[45] Date of Patent: Jan. 14, 1997

US005593922A

[54] METHOD FOR BURIED CONTACT ISOLATION IN SRAM DEVICES

[75] Inventors: Jhon-Jhy Liaw, Taipei; Hsien W. Chin, Hsin Chu, both of Taiwan

[73] Assignee: Taiwan Semiconductor Manufacturing Company Ltd., Hsin-Chu, Taiwan

[21] Appl. No.: 660,301

[22] Filed: Jun. 7, 1996

[51] Int. Cl.$^6$ .............................. H01L 21/44; H01L 21/60
[52] U.S. Cl. .................... 437/195; 437/52; 148/DIG. 20
[58] Field of Search ............................... 437/52, 60, 195, 437/186; 148/DIG. 20

[56] References Cited

U.S. PATENT DOCUMENTS

| | | | |
|---|---|---|---|
| 4,804,636 | 2/1989 | Groover, III et al. | 437/52 |
| 5,240,874 | 8/1993 | Roberts | 437/69 |
| 5,272,099 | 12/1993 | Chou et al. | 437/41 |
| 5,439,835 | 8/1995 | Gonzalez | 437/35 |
| 5,521,113 | 5/1996 | Hsue et al. | 437/52 |

*Primary Examiner*—H. Jey Tsai
*Attorney, Agent, or Firm*—George O. Saile

[57] ABSTRACT

A method for fabrication of polysilicon buried contacts is described which overcomes the problems of current leakage which occur at sub-micron spacings between these contacts. The failure of the conventional channel stop protection at these spacings is compensated for by performing the buried contact anti-punchthrough ion-implant using large-angle-tilt (LAT) implantation. This provides adequate dopant under the edge of the field oxide to eliminate excessive current leakages between buried contacts at sub-micron spacings. The method is particularly effective in the manufacture of static random access memories (SRAMs) where such sub-micron spacings occur to a large degree.

34 Claims, 4 Drawing Sheets

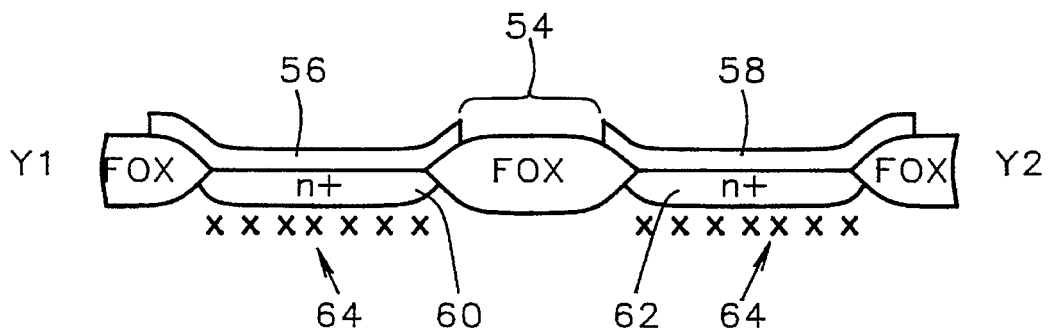
*FIG. 3 — Prior Art*
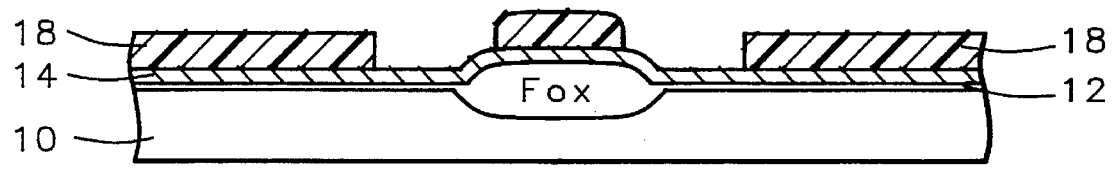
*FIG. 4 — Prior Art*

METHOD FOR BURIED CONTACT ISOLATION IN SRAM DEVICES

BACKGROUND OF THE INVENTION (1) Field of the Invention

The invention relates to processes for the manufacture of semiconductor devices and more particularly to processes for forming buried contacts.

(2) Description of Prior Art

Very large scale integrated circuit technology (VLSI) comprises the formation of isolated semiconductor devices within the surface of silicon wafers and interconnecting these devices with wiring layers above the surface. This interconnection system usually consists of two or more levels of interconnection metallurgy, separated by insulation layers. The first level of interconnection is used to define small fundamental circuits, for example, a simple TTL gate comprised of two bi-polar transistors and two resistors. Memory cells, in particular, require many such local interconnect ions.

A static-random-access-memory (SRAM) cell design which has gained particular favor in recent times is the poly-load cell shown schematically in FIG. 1. This cell utilizes polysilicon load resistors in place of the metal-oxide-silicon-field-effect-transistors (MOSFETs) used in earlier n-channel MOS (NMOS) and complementary MOS (CMOS) designs.

With only four resistors and the high-valued polysilicon resistors fabricated in a second polysilicon level above the cell, a much smaller amount of space is required. The power consumption of the poly-load cell is considerably less than the NMOS SRAM. Unlike CMOS arrays, poly-load cell arrays can be fabricated entirely within a single p-type well and supported by full CMOS peripheral circuitry.

The quest for miniaturization and the driving need for higher and higher density of memory cells has fueled the development of local-interconnect technology. The success and extensive use of polysilicon as the MOSFET gate material has played a dominant role in this development and, in the sub-micron technology of today, it has become the most important material used for forming these connections. Previous technology used an aluminum alloy for short wiring runs such as from a gate electrode to an adjacent drain. These links were referred to as butted contacts because the contact window was opened to expose both the polysilicon and the adjacent drain. The buried contact came into existence with the use of polysilicon. When in-situ doped polysilicon is deposited over a thin gate oxide layer to form the transistor gate, it is simultaneously deposited into openings in this oxide which expose a portion of the active region adjacent to field oxide of the MOSFET device. Dopant from the polysilicon can then be driven into the silicon forming an extension of the active region under the polysilicon, thereby forming an ohmic contact between the polysilicon and the active region. The polysilicon extends over the thick field oxide region and can be continuous with a polysilicon gate.

The poly-load cell in FIG. 1 has local interconnects formed with buried contacts where the polysilicon gates of the driver transistors M1 and M2 are connected to the drain regions of the access transistors M3 and M4. In the conventional SRAM array design, these buried contacts often lie in close proximity to each other and to similar buried contacts of adjacent cells. For the newer sub-half micron SRAM designs, the spacings between buried contacts approach 0.5 to 1.0 microns.

In FIG. 2 there is shown the top view of a portion of an SRAM array with buried contacts of adjacent cells lying in close proximity 54. Polysilicon gate stripes 56 and 58 are connected to drain regions 60 and 62 by buried contacts 50 and 52.

A cross-section of the region denoted by Y1-Y2 is shown in FIG. 3A. Tightly packed designs of contemporary SRAMs have reduced the spacing 54 to the extent where current channeling between buried contacts under the field oxide FOX has become a serious concern. The n+ regions 60 and 62 under the buried contact are formed by an ion implantation after the buried contact regions 50 and 52 have been exposed using standard photolithographic techniques. A deep boron implant 64 is performed at this time to improve buried contact isolation. However, the contemporary implant, which is performed at a 0° to 7° tilt angle is inadequate for preventing current leakage between the buried contacts 50 and 52 when the spacing 54 falls below 1 micron.

Oblique or Large-Angle-Tilt (LAT) ion-implants have found numerous applications in sub-micron technology. They have been successfully used to provide fully overlapped lightly-doped-drain (LDD) structures for ¼ micron MOSFETS. Here the LDD is implanted under the polysilicon gate by directing the dopant ions obliquely at the edge of the gate. Gonzalez U.S. Pat. No. 5,439,835 has shown that LAT can be used to deposit boron under one side of a polysilicon gate in a DRAM to provide punchthrough protection without compromising the other side which faces the storage node. At the same time boron is deposited through the center region of the field oxide to form a channel stop. Roberts U.S. Pat. No. 5,240,874 similarly reports an oblique channel stop implant into the silicon below the field oxide to control channel width for an SRAM process. This implant is accomplished through the field oxide and reaches the area below the birds-beak by virtue of a high implant angle. An additional masking step is required for this procedure to protect the device regions external to the field oxide.

SUMMARY OF THE INVENTION

It is an object of this invention to implant a special channel stop under the FOX side of a buried contact in order to provide effective isolation between closely spaced buried contact regions. Conventional channel stop implants placed under the FOX prior to FOX oxidation become ineffective when spacings between buried contacts separated by FOX become less than one micron. The improved channel stop implant is accomplished by modifying the buried contact anti-punchthrough implant to directly place channel stop dopant under the FOX edge of the buried-contact using Large-Angle-Tilt (LAT) implanting. This implant, conventionally performed at a low angle (between 0° and 7° from the normal) into the buried contact opening is now accomplished at oblique angles ranging from 20° to 45°. Not only is anti-punchthrough protection provided by placing dopant below the active drain region but isolation of the buried contact from nearby devices is provided by dopant placed laterally, under the field isolation edge, adjacent to the buried contact.

BRIEF DESCRIPTION OF THE DRAWINGS

FIG. 3 is a cross section of buried contacts in a poly-load cell SRAM formed by a prior-art process.

FIG. 4 is a cross sectional view of two buried contact openings in close proximity defined by photoresist.

DESCRIPTION OF THE PREFERRED EMBODIMENT

In a preferred embodiment of this invention a p-type monocrystalline silicon wafer substrate is provided. The wafer is processed using prior art procedures, to the point where the buried contact openings to the active device regions have been made. FIG. 4 is a cross section of a portion of an integrated circuit die where two buried contacts are to be formed. A short field oxide (FOX) region is depicted to show the close proximity of the contacts. A gate insulator of silicon oxide 12 has been formed over the devices areas and a thin layer of undoped polysilicon 14 protects the gate oxide 12 in the device region. A layer of photoresist 18 has been patterned to define the buried contact openings. For the purpose of illustration, the formation of self-aligned gate MOSFETS will be shown in the description of this embodiment although their gates need not necessarily occur in the plane of the cross section shown. The gates may be located at some point above or below the plane of the page.

Figure 1:
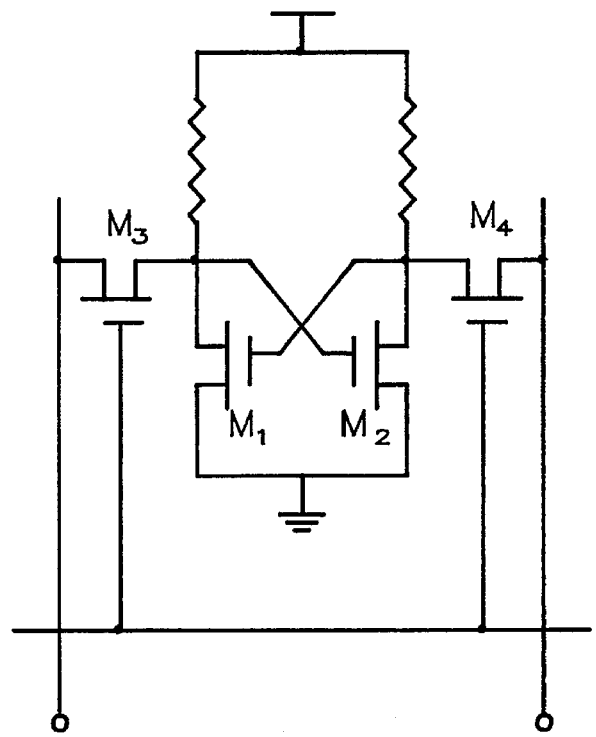
FIG. 1 Shows a schematic representation of a poly-load cell SRAM.
Figure 2:
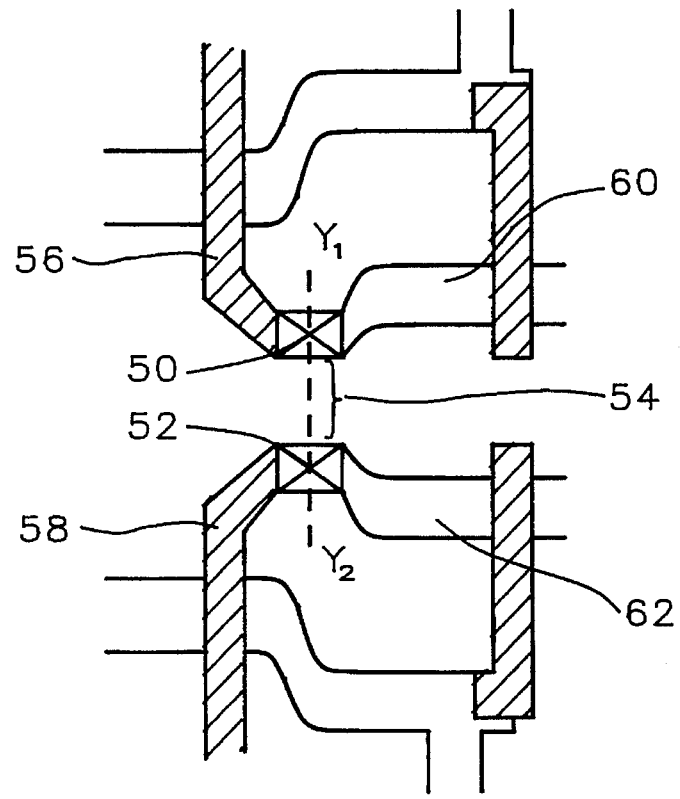
FIG. 2 is the top view of a portion of a poly-load cell SRAM.
Figure 5A:
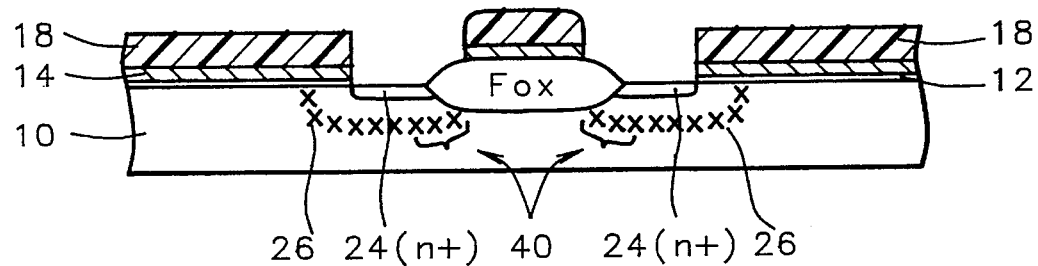
FIGS. 5A to 5D show cross sections of the steps of forming a buried contact as taught by this invention.

Referring now to FIG. 5A, The thin undoped polysilicon layer 14 and the gate oxide layer 12 in the buried contact openings are etched, typically by reactive-ion-etching (RIE), exposing the silicon wafer surface.

Phosphorous is implanted at 0° to 7° tilt and at an energy of between 20 and 50 keV. The dosage is between $1 \times 10^{15}$ and $3 \times 10^{15}$ atoms/cm$^2$, producing the buried contact n+ pockets 24. Next the buried contact anti-punchthrough (APT) implant is performed at an angle of between 20° and 45° from the direction normal to the wafer. The resultant implant 26 provides an additional channel-stop barrier 40 under the base of the birds-beak of the field implant (FOX) which is lacking in the prior art APT implant shown in FIG. 3.

The APT implant consists of boron at a dose of $1 \times 10^{13}$ to $8 \times 10^{13}$ atoms/cm$^2$ at energies ranging from 80 to 180 keV. This deploys the boron at a depth of between 2,000 to 4,000 Angstroms below the silicon surface. The preferred wafer tilt angle is between 20° and 45°. the wafer is continuously rotated during the implantation so that the entire perimeter of the opening receives the angled implant.

Figure 5B:
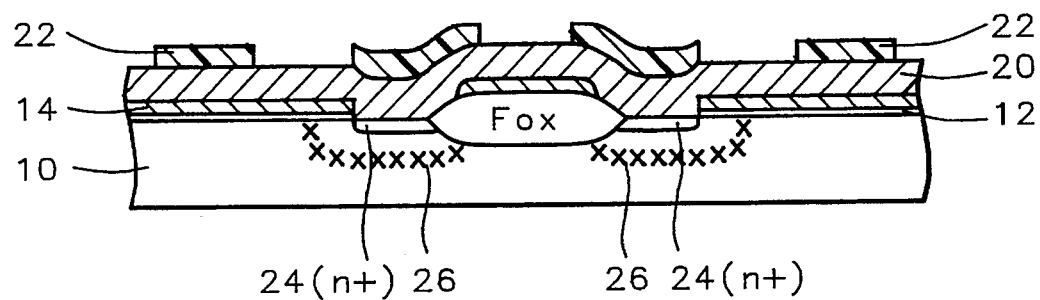

Prior art processing is then used to form self-aligned polysilicon gate MOSFETs. Referring to FIG. 5B, a second layer of polysilicon 20 is deposited. This layer is in-situ doped with arsenic. A second layer of photoresist 22 then defines the polysilicon stripes which extend from the buried contacts to become the gate electrodes of the MOSFETs. Again, using RIE, the excess polysilicon is etched away forming the completed LI with the buried contact 34 and the gate electrodes 32 of the MOSFETS. Connection of the buried contact 34 to a gate can occur over the field oxide (FOX) region where additional connections may also be formed.

Figure 5C:
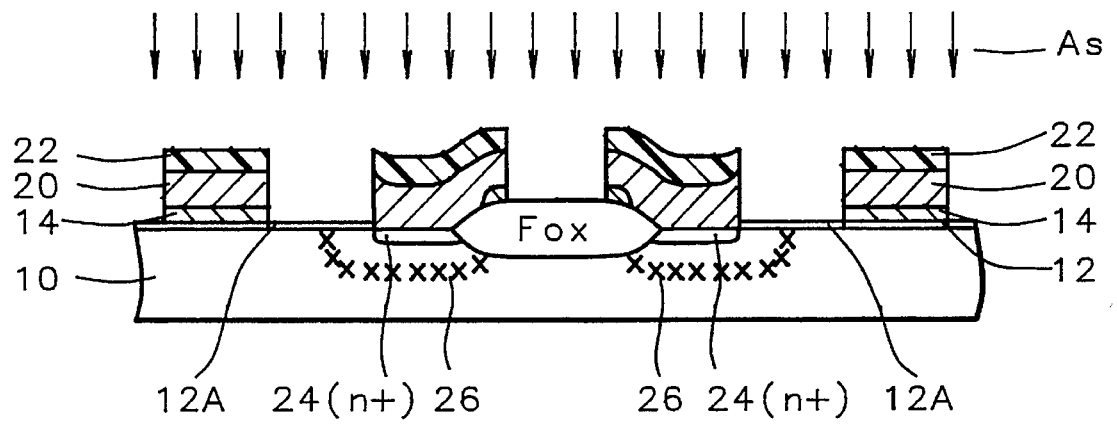

Referring now to FIG. 5C, the exposed portions of the silicon oxide layer 12A are dip etched away with dilute hydrofluoric acid. The source and drain regions 30 as well as the polysilicon gates 32 are implanted with arsenic in the conventional manner to complete the formation of the self-aligned-polysilicon-gate MOSFETS. A subsequent thermal anneal fuses the contacts and activates the implanted dopants.

Figure 5D:
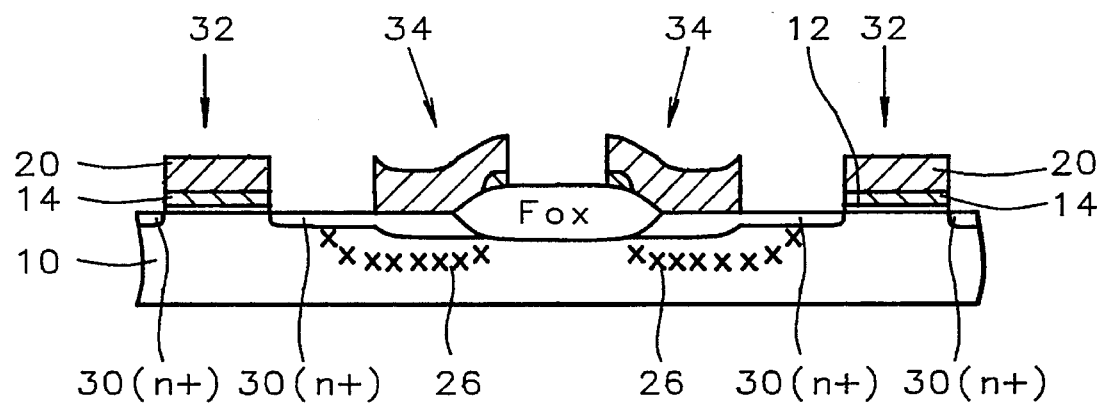

FIG. 5D shows the composite drain active areas 30 consisting of the drain implants and the buried contact implants. The broad isolation regions 26 under the contact section of the drains 30 and along the lower edge of the field oxide (FOX) form a continuous barrier against channeling under the field oxide.

Further processing comprises the deposition of an inter-level dielectric (ILD) layer over the wafer, forming contacts, and fabricating the remaining interconnections of the integrated circuit.

The effectiveness of the LAT isolation implant 26 shown by the data in Table I.

TABLE I

| Effect of boron implant angle on buried contact isolation | | | | |
|---|---|---|---|---|
| BC-to-BC spacing (μm) | BC-to-BC Parameter | Implant angle | | |
| | | 7° | 15° | 30° |
| 0.9 | Breakdown(Volts) | 9.16 | 9.28 | 9.94 |
| | Leakage (pA) | 0.06 | 0.06 | 0.06 |
| 0.8 | Breakdown(Volts) | 9.0 | 9.06 | 9.90 |
| | Leakage (pA) | 0.2 | 0.12 | 0.06 |
| 0.73 | Breakdown(Volts) | 5.0 | 5.5 | 9.06 |
| | Leakage (pA) | 20,000 | 8,766 | 0.1 |

Table I shows that, for a spacing of 0.9 microns, the additional boron enhancement under the field oxide edge provided by the LAT buried contact ATP boron implant has no appreciable effect on the bc-to-bc leakage. However, when the spacing decreases by only 0.1 micron the effectiveness of the LAT boron enhancement in preventing isolation failure becomes apparent.

When the buried contact APT boron implant is accomplished at an angle of 7°, as in the prior art process, The breakdown voltage is nearly halved and the leakage current between the contacts increases five-fold when the spacing decreases from 0.9 microns to 0.73 microns. Increasing the angle to 30° at the 0.73 micron spacing provides sufficient boron under the field oxide to restore the leakage and breakdown to acceptable levels.

The embodiment of FIGS. 3–5 uses a p-type substrate. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated.

Correspondingly, whereas the embodiment uses arsenic or phosphorous as the implant for the source and drain implants in a p-type well, boron would be used as an implant in an n-type well. By the same argument, whereas, for an n-channel MOSFET, the dopant used for the buried contact APT implant is boron, in a p-channel MOSFET the corresponding implant would be an n-type dopant such as phosphorous.

While the invention has been particularly shown and described with reference to the preferred embodiments thereof, it will be understood by those skilled in the art that various changes in form and details may be made without departing from the spirit and scope of the invention.

What is claimed is:

1. A method for forming a buried contact on a silicon semiconductor wafer with improved isolation comprising:

providing a semiconductor wafer having field isolation regions within its surface which define isolated areas of exposed silicon wherein semiconductor devices are to be formed;

forming a silicon oxide layer over said areas of exposed silicon;

forming a first layer of polysilicon over said semiconductor wafer;

depositing a first layer of photoresist over said semiconductor wafer;

patterning said first layer of photoresist to define buried contact openings;

etching said first layer of polysilicon with a unidirectional dry etching technique to provide vertical walled buried contact openings in said first layer of polysilicon, thereby exposing the subjacent silicon oxide layer;

removing said silicon oxide layer within said buried contact openings;

implanting a first dose of dopant atoms;

implanting a second dose of dopant atoms;

removing said first layer of photoresist;

forming a second layer of polysilicon over said semiconductor wafer;

depositing a second layer of photoresist over said semiconductor wafer;

patterning said second layer of photoresist to define local interconnect structures and gate structures for semiconductor devices;

etching said second layer of polysilicon and subjacent first layer of polysilicon with a unidirectional dry etching technique to provide vertical walled openings in said first and second layers of polysilicon, thereby exposing the subjacent silicon oxide layer;

implanting a third dose of dopant atoms; and annealing said semiconductor wafer.

2. The method of claim 1 wherein the thickness of the silicon oxide layer is between about 70 Angstroms and 200 Angstroms.

3. The method of claim 1 wherein the thickness of the first layer of polysilicon is between about 300 and 700 Angstroms.

4. The method of claim 1 wherein the unidirectional etching technique is reactive-ion-etching using chlorine and conditions conducive to provide vertical sidewalls, a high silicon-to-silicon oxide etch rate ratio, and precise end-point detection.

5. The method of claim 4 wherein the method of endpoint detection is optical emission spectroscopy using the magnitude of the carbon monoxide signal as an indicator of endpoint.

6. The method of claim 1 wherein the silicon oxide layer is removed by a dip etch in dilute hydrofluoric acid.

7. The method of claim 1 wherein the areas of exposed silicon are p-type.

8. The method of claim 7 wherein the first dose of dopant atoms is between about $1\times10^{15}$ and $3\times10^{15}$ atoms/cm$^2$ of phosphorous implanted at an energy of between about 20 and 50 keV.

9. The method of claim 8 wherein the second dose of dopant atoms is between about $1\times10^{13}$ and $8\times10^{13}$ atoms/cm$^2$ of boron implanted at an energy of between about 80 and 180 keV and at an incident angle of between about 20 degrees and 45 degrees from the normal to the silicon wafer.

10. The method of claim 9 wherein the wafer is continuously rotated during ion implantation.

11. The method of claim 7 wherein the first dose of dopant atoms is between about $1\times10^{13}$ and $8\times10^{13}$ atoms/cm$^2$ of boron implanted at an energy of between about 80 and 180 keV and at an incident angle of between about 20 degrees and 45 degrees from the normal to the silicon wafer.

12. The method of claim 11 wherein the wafer is continuously rotated during ion implantation.

13. The method of claim 11 wherein the second dose of dopant atoms is between about $1\times10^{15}$ and $3\times10^{15}$ atoms/cm$^2$ of phosphorous implanted at an energy of between about 20 and 50 keV.

14. The method of claim 7 wherein the thickness of the second layer of polysilicon is between about 500 and 2,700 Angstroms.

15. The method of claim 7 wherein the second layer of polysilicon is in-situ doped with phosphorous to a concentration of between about $1\times10^{20}$ and $1\times10^{21}$ atoms/cm$^3$.

16. The method of claim 7 wherein the third dose of dopant atoms is between about $2\times10^{15}$ and $6\times10^{15}$ atoms/cm$^2$ of arsenic implanted at an energy of between about 25 and 60 keV.

17. The method of claim 1 wherein said buried contact openings are separated from each other by field oxide isolation regions thereby being separated from each other by a spacing of between 0.5 and 10 microns.

18. A method for forming an SRAM array on a silicon semiconductor wafer having buried contacts comprising:

providing a semiconductor wafer having field isolation regions within its surface which define isolated areas of exposed silicon wherein semiconductor devices are to be formed;

forming a silicon oxide layer over said areas of exposed silicon;

forming a first layer of polysilicon over said semiconductor wafer;

depositing a first layer of photoresist over said semiconductor wafer;

patterning said first layer of photoresist to define buried contact openings;

etching said first layer of polysilicon with a unidirectional dry etching technique to provide vertical walled buried contact openings in said first layer of polysilicon, thereby exposing the subjacent silicon oxide layer;

removing said silicon oxide layer within said buried contact openings;

implanting a first dose of dopant atoms;

implanting a second dose of dopant atoms;

removing said first layer of photoresist;

forming a second layer of polysilicon over said semiconductor wafer;

depositing a second layer of photoresist over said semiconductor wafer;

patterning said second layer of photoresist to define local interconnect structures and gate structures for semiconductor devices;

etching said second layer of polysilicon and subjacent first layer of polysilicon with a unidirectional dry etching technique to provide vertical walled openings in said first and second layers of polysilicon, thereby exposing the subjacent silicon oxide layer;

implanting a third dose of dopant atoms;

annealing said semiconductor wafer;

depositing a layer of glass over said semiconductor wafer; and continuing interconnection processing to produce completed integrated circuit chips.

19. The method of claim 18 wherein the thickness of the silicon oxide layer is between 70 Angstroms and 200 Angstroms.

20. The method of claim 18 wherein the thickness of the first layer of polysilicon is between about 300 and 700 Angstroms.

21. The method of claim 18 wherein the unidirectional etching technique is reactive-ion-etching using chlorine and conditions conducive to etching vertical sidewalls, a high silicon-to-silicon oxide etch rate ratio, and precise end-point detection.

22. The method of claim 21 wherein the method of endpoint detection is optical emission spectroscopy using the magnitude of the carbon monoxide signal as an indicator of endpoint.

23. The method of claim 18 wherein the silicon oxide layer is removed by a dip etch in dilute hydrofluoric acid.

24. The method of claim 18 wherein the areas of exposed silicon are p-type.

25. The method of claim 24 wherein the first dose of dopant atoms is between about $1 \times 10^{15}$ and $3 \times 10^{15}$ atoms/$cm^2$ of phosphorous implanted at an energy of between about and 50 keV.

26. The method of claim 25 wherein the second dose of dopant atoms is between about $1 \times 10^{13}$ and $8 \times 10^{13}$ atoms/$cm^2$ of boron implanted at an energy of between about 80 and 180 keV and at an incident angle of between about 20 degrees and 45 degrees from the normal to the silicon wafer.

27. The method of claim 26 wherein the wafer is continuously rotated during ion implantation.

28. The method of claim 24 wherein the first dose of dopant atoms is between about $1 \times 10^{13}$ and $8 \times 10^{13}$ atoms/$cm^2$ of boron implanted at an energy of between about 80 and 180 keV and at an incident angle of between about 20 degrees and 45 degrees from the normal to the silicon wafer.

29. The method of claim 28 wherein the wafer is continuously rotated during ion implantation.

30. The method of claim 28 wherein the second dose of dopant atoms is between about $1 \times 10^{15}$ and $3 \times 10^{15}$ atoms/$cm^2$ of phosphorous implanted at an energy of between about 20 and 50 keV.

31. The method of claim 24 wherein the thickness of the second layer of polysilicon is between about 500 and 2,700 Angstroms.

32. The method of claim 24 wherein the second layer of polysilicon is in-situ doped with phosphorous to a concentration of between about $1 \times 10^{20}$ to $1 \times 10^{21}$ atoms/$cm^3$.

33. The method of claim 24 wherein the third dose of dopant atoms is between about $2 \times 10^{15}$ and $6 \times 10^{15}$ atoms/$cm^2$ of arsenic implanted at an energy of between about 25 and 60 keV.

34. The method of claim 18 wherein said buried contact openings are separated from each other by field oxide isolation regions thereby being separated from each other by a spacing of between 0.5 and 10 microns.

* * * * *